United States Patent [19]

Merrick

[11] Patent Number: 4,563,655

[45] Date of Patent: Jan. 7, 1986

[54] AGC CIRCUIT

[75] Inventor: Edwin B. Merrick, Stow, Mass.

[73] Assignee: Hewlett-Packard Company, Palo Alto, Calif.

[21] Appl. No.: 621,402

[22] Filed: Jun. 18, 1984

Related U.S. Application Data

[63] Continuation-in-part of Ser. No. 595,756, Apr. 2, 1984.

[51] Int. Cl.$^4$ .............................................. H03G 3/10
[52] U.S. Cl. ..................................... 330/285; 330/279
[58] Field of Search ............... 330/278, 279, 284, 285, 330/262

[56] References Cited

U.S. PATENT DOCUMENTS

3,988,694 10/1976 Yamazaki .............................. 330/278

Primary Examiner—Eugene LaRoche
Assistant Examiner—G. Wan
Attorney, Agent, or Firm—Donald N. Timbie

[57] ABSTRACT

An automatic gain control circuit in which a current source is provided for charging a capacitor and a current source is provided for discharging it, there being means for controlling the ratio of the currents supplied by each source in response to the amplitude of the alternating wave being controlled.

11 Claims, 17 Drawing Figures

AGC CIRCUIT

BACKGROUND OF THE INVENTION

This application is a continuation-in-part of my U.S. patent application Ser. No. 06/595,756, filed on Apr. 2, 1984, and entitled "Transducer Coupling".

Circuits for deriving an automatic gain control voltage having an amplitude corresponding to the variations in the amplitude of the peaks of an alternating current wave generally utilize rectifying circuits having a diode connected between a source of the alternating current wave and a parallel combination of a capacitor and a resistor. When the amplitude of successive peaks of the wave is increasing, the capacitor is charged by current flowing through the diode so as to increase the voltage across the capacitor; and when the amplitude of successive peaks is decreasing, the capacitor is discharged by charge leaking through the resistor so as to decrease the voltage across the capacitor Whereas the time constant of the charging circuit can be made so short as to enable the voltage across the capacitor to follow rapid increases in the amplitude of the peaks, it is necessary for the time constant of the discharging circuit, which is the product of the resistance of the resistor and the capacitance of the capacitor, to be a compromise between the value required to permit the voltage across the capacitor to follow a sharp decrease in the amplitude between successive peaks and the value required to prevent a significant drop in voltage across the capacitor between peaks in a situation where the amplitude of the peaks remains constant. Thus, the automatic gain control voltage across the capacitor can follow sudden increases in ampliutde of the wave but does not follow sudden decreases in its amplitude as well.

BRIEF SUMMARY OF THE INVENTION

In a circuit of this invention, the charge and discharge time constants can be made the same and short enough to permit the automatic gain control voltage to follow sudden changes in the amplitude of the wave in either direction while at the same time permitting the voltage to remain constant in a situation where there is no change in the amplitude of the wave. It is also possible to make the time constants long and/or different, if desired. In accordance with this invention, this is accomplished by providing two current sources for respectively charging and discharging the capacitor across which the automatic gain control voltage is to be developed and controlling these sources in response to the amplitude of the alternating wave in such manner that the ratio of the charges they pass during a period having a duration equal to half a cycle of the alternating wave depends on whether the amplitude of the wave is greater or less than a predetermined value at which the charges passed are the same. A simple way of doing this is to enable one of the current sources during a period when a half-cycle of the wave exceeds a given level and to enable the other current source during a shorter period when a half-cycle exceeds a higher level. As the amplitude of the wave varies, the ratio of the lengths of the periods during which the current sources are respectively made operative will also vary. In addition, it is necessary that the current source that is enabled for the shorter period be capable of supplying more integrated current during its portion of a half-cycle so that there will be an amplitude of the wave at which the charge supplied by one current source will equal the charge removed by the other current source.

If, as in some embodiments, the current sources are controlled by portions of the wave occurring during their respective periods of enablement, the current gain of the source having the shorter period should be greater than the current gain of the source having the longer period. In another embodiment having constant current sources that are enabled for periods of different lengths, the amplitude of the constant current supplied by the source having the shorter period should be greater than the amplitude of the constant current supplied by the other source.

At the desired amplitude of the wave, the charge added to the capacitor by one current source during its period of enablement is the same as the charge removed from the capacitor by the other current source during its period of enablement so that the net change in charge is zero and the voltage across the capacitor has the same value after the periods that it had before they began. Should the amplitude of the wave increase, the ratio of the lengths of the periods changes so that there is a net change in charge on the capacitor that causes a change in voltage across it in one direction. Should the amplitude of the wave decrease, the ratio of the lengths of the periods changes oppositely so that there is a net change in charge on the capacitor that causes a change in voltage across it in the opposite direction.

BRIEF DESCRIPTION OF THE DRAWINGS

FIG. 2A represents an input wave $V_{IN}$ for the circuit of FIG. 2 having the desired amplitude;

DETAIL DESCRIPTION OF THE INVENTION

Figure 1:
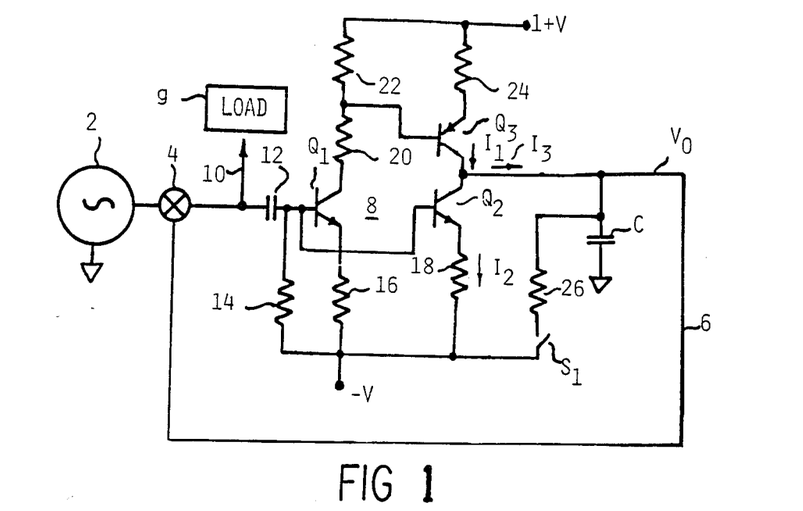
FIG. 1 is a schematic representation of one form of circuit embodying the invention.

FIG. 1 is a schematic diagram of an AGC system utilizing a circuit shown and described in the above-referenced patent application that derives the AGC voltage in accordance with this invention. An unregulated alternating voltage source 2 is coupled to means 4 for controlling its amplitude in accordance with an AGC voltage produced on a lead 6 by an AGC circuit 8. The regulated AC voltage is supplied to any desired load 9 via a lead 10.

A capacitor 12 is connected between the output of the amplitude control means 4 and the bases of dual NPN transistors $Q_1$ and $Q_2$, and a resistor 14 is connected between the bases and a point of potential $-V$. $Q_2$ is a current source providing a current $I_2$. Resistors 16 and 18 are respectively connected between the emitters of $Q_1$ and $Q_2$ and $-V$ so that the collector currents will be proportional to base voltage above $V_{BE}$, which is approximately 0.6 volt. The collector of $Q_1$ is connected to $+V$ via series resistors 20 and 22, and their junction is connected to the base of an NPN transistor $Q_3$ having its collector connected to the collector of $Q_2$ and its emitter connected by a resistor 24 to $+V$. $Q_3$ is a current source providing a current $I_1$. Note that $Q_1$, $Q_2$ and $Q_3$ are such that current can flow through them from $+V$ to $-V$. One side of the capacitor C is connected to ground and the other side is connected via the lead 6 to the collectors of $Q_2$ and $Q_3$. A resistor 26 is connected between $-V$ or $+V$, in this case $-V$, and the ungrounded side of C via a switch $s_1$ that can be momentarily closed for start-up purposes.

Operation of the AGC circuit 8 is as follows. As $Q_2$ turns on during positive half-cycles, it draws current $I_2$ from the capacitor C so as to charge the capacitor C negatively. Initially, $Q_1$'s collector current merely causes a voltage drop across the resistors 20 and 22, but as this current increases it begins to turn on the current source $Q_3$. If $Q_3$ has a sufficient beta, its collector current $I_1$ will increase more than the incremental increase in $Q_2$'s collector current $I_2$ above the point where $Q_3$ starts to conduct. Therefore, even though it starts to conduct later, $Q_3$'s collector current can quickly exceed that of $Q_2$. The period of conduction of the current source $Q_2$ that suplies $I_2$ is longer than the period of conduction of the current source $Q_3$ that supplies the current $I_1$. The current $I_3$ flowing through the output capacitor C is the difference between $I_1$ and $I_2$.

There is a given peak amplitude of the AC voltage at the output of the amplitude control means 4 which will cause $Q_2$'s and $Q_3$'s integrated collector currents occurring during each positive half-cycle to be equal so that no net charge is delivered to the capacitor C. Greater peak amplitude than this will cause $Q_3$'s collector current to dominate so that the voltage on the capacitor C rises incrementally for each oscillator cycle until the peak of the AC voltage at the output of the amplitude control means 4 is reduced to the given peak amplitude. Lesser peak amplitude will cause $Q_2$'s collector current to dominate so that the voltage on the capacitor C falls incrementally with each succeeding oscillator cycle until the peak amplitude of the AC voltage at the output of the amplitude control means 4 is increased to the given amplitude. At a given frequency of the AC voltage, this operation might be described as a proportional charge pump; that is, for a given amplitude error, a net increment of charge will be transferred to or from the capacitor C during successive cycles of the input frequency. A larger error will cause a proportionally larger charge increment to be transferred to or from the capacitor C.

Figure 1A:
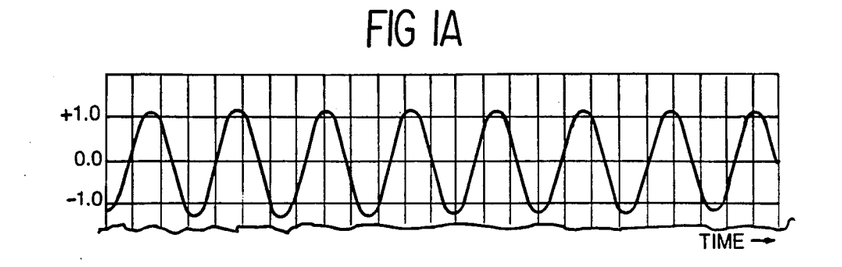
FIG. 1A ilustrates a wave referenced to ground for which a signal corresponding to its amplitude variation is to be derived.
Figure 1B:
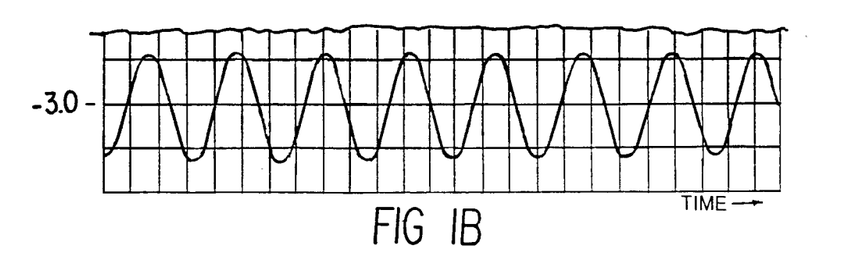
FIG. 1B illustrates the wave of FIG. 1A referenced to the input of one of the transistors used in the circuit.

The waveforms of FIGS. 1A through 1E will be helpful to further visualize the operation of the AGC circuit. FIG. 1A shows the AC waveform at the output of the regulator 4 which is referenced to ground and which is the input to the AGC circuit at the left side of the capacitor 12. It happens to be a little over a volt in peak amplitude. Even though it is difficult to see with the scale used, the amplitude of the AC voltage supplied by the source 2 starts to increase at $t=0$. FIG. 1B shows the same AC waveform at the right side of the capacitor 12 where it is referenced to $-V$.

Figure 1C:
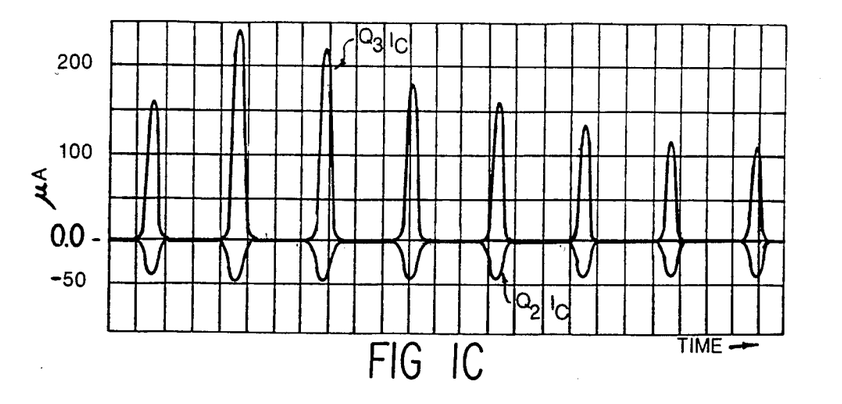
FIG. 1C illustrates the currents provided by the current sources of FIG. 1 in a given example.

The upwardly extending positive peaks of FIG. 1C show the current flowing through the charging source $Q_3$ and the downwardly extending negative peaks show the current flowing through the discharging source $Q_2$. The latter are shown with inverted polarity because $I_2$ is flowing out of the capacitor C. Note that the discharging current source $Q_2$ is operative during a first central portion of a half-cycle of the AC wave and that the charging current source $Q_3$ is operative during a second central portion of the half-cycle that is shorter than the first. The reason for these periods of conduction having different lengths is that $Q_3$ is not turned on until the current supplied by $Q_1$ causes the voltage at the junction of the resistors 20, 22 to be sufficient to bias the base of $Q_3$ for conduction.

Figure 1D:
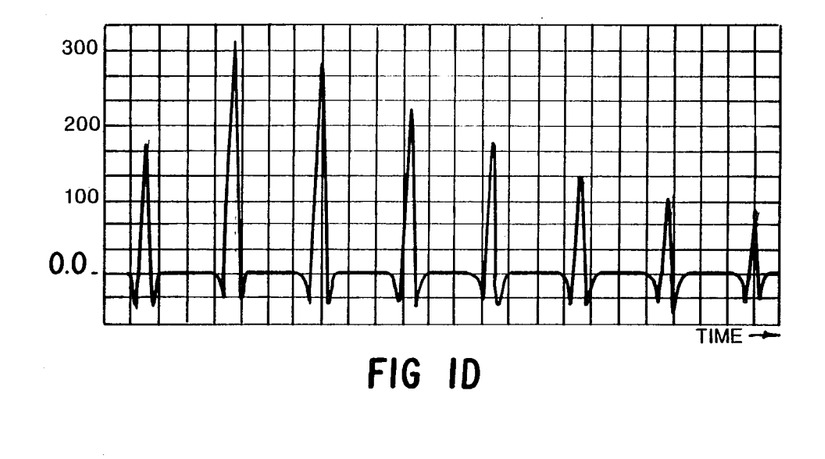
FIG. 1D is a composite of the currents of FIGURE 1C.
Figure 1E:
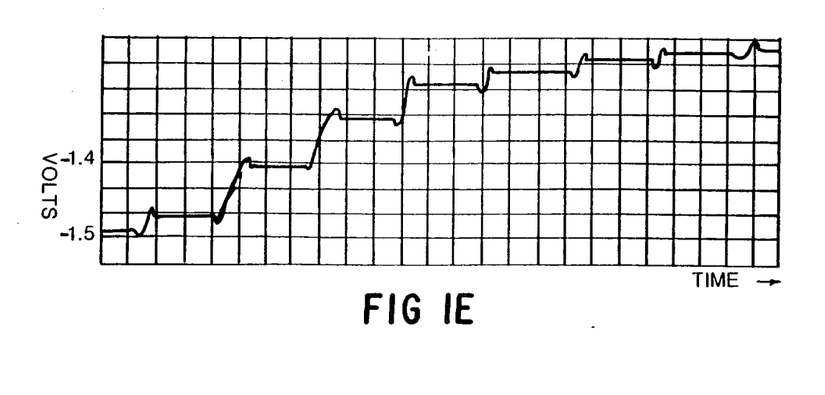
FIG. 1E illustrates the stair step change in voltage that is produced across the output capacitor in the given example.

FIG. 1D shows the combined collector current of $Q_2$ and $Q_3$ on the same plot. The purpose of the capacitor C is to integrate the currents respectively flowing to and from it and to store a resultant voltage during the portion of the alternating waveform when neither $Q_2$ or $Q_3$ are conducting. FIG. 1E shows the control signal voltage stored on the capacitor C. One step occurs during each cycle.

At one particular amplitude of the wave, which is the desired amplitude, the current source $Q_3$ will add as much total positive charge to the output capacitor C as the current source $Q_2$ removes from it. Even though $Q_3$ conducts for a shorter period, its current gain is sufficiently greater than that of $Q_2$ that it can supply the same amount of charge. If the amplitude of the wave increases, $Q_1$ and $Q_2$ will be turned on earlier in a half-cycle so that their periods of conduction are increased; but $Q_3$ will also be turned on earlier in the half-cycle so that its period of conduction is also increased. The ratio of the period of conduction of $Q_3$ to the period of conduction of $Q_2$ increases as does the ratio of their respective currents. Then, as the AGC circuit begins to reduce the amplitude of the wave, these ratios start to decrease.

The effect of this action is shown by the relationship between the area of the positive pulses with respect to the area of the negative pulses in FIG. 1C and by the positive steps in FIG. 1E that illustrate the voltage across the capacitor C. When the amplitude reaches the desired value, as it nearly does at the right-hand end of the graphs, the area under the positive pulse once again equals the area under the negative pulse and there is no net change in the charge of the output capacitor C.

Although the conduction periods of the current sources occur during the same half-cycle of the applied alternating wave, it would be within the scope of this invention to make them occur during different half-cycles. It is only desirable that the conduction periods take place during a period having a duration of a half-cycle.

As previously noted, the effective time constant of the circuit that is related to reducing the amplitude of a wave and the effective time constant of the circuit related to increasing the amplitude of the wave can be made short and equal, but they can be made longer by increasing the values of the resistors 16 and 18, and they can be made unequal by changing the values of the resistors 22 and 24.

Figure 2:
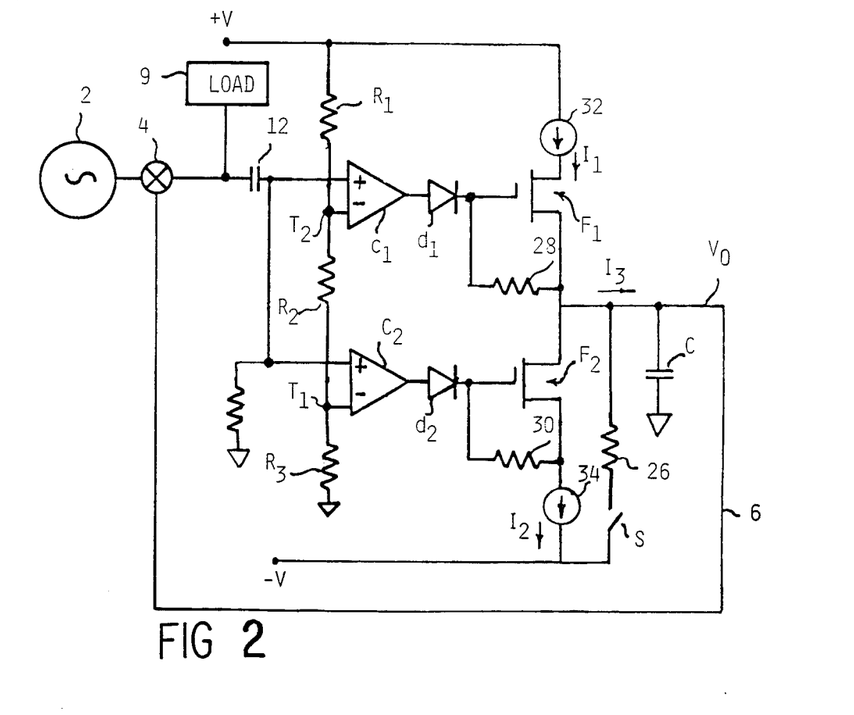
FIG. 2 is a schematic representation of a circuit embodying the invention in which constant current sources are controlled by comparators.

FIG. 2 is a schematic diagram of a circuit embodying the invention in which comparators are used to control the periods of operation of current sources. Components corresponding to those of FIG. 1 have the same designations. The AC waves from the regulator 4 are coupled via the capacitor 12 to the positive inputs of comparators $C_1$ and $C_2$ Resistors $R_1$, $R_2$ and $R_3$ are connected in the order named between $+V$ and ground. The negative input of $C_1$ is connected to the junction of $R_1$ and $R_2$ so as to receive a DC voltage $T_2$, and the negative input of $C_2$ is connected to the junction of $R_2$ and $R_3$ so as to receive a DC voltage $T_1$ that is less than $T_2$. A diode $d_1$ is connected so as to conduct current from the output of $C_1$ to the gate electrode of a FET $F_1$, and a resistor 28 is connected between the gate and drain electrodes of $F_1$. Similarly, a diode $d_2$ is connected so as to conduct current from the output of $C_2$ to the gate electrode of a FET $F_2$, and a resistor 30 is connected between the gate and drain electrodes of $F_2$. A source 32 of constant current $I_1$ is connected between $+V$ and the source electrode of $F_1$, and a source 34 of constant current $I_2$ is connected between the drain electrode of $F_2$ and $-V$. The current sources can be of any suitable type such as field effect or bipolar transistors but $I_1$ must be greater than $I_2$. The drain electrode of $F_1$ and the source electrode of $F_2$ are connected to the lead 6 on which the output voltage $V_O$ of the circuit that is developed across the output capacitor C appears. The start-up resistor is connected between $-V$ and the lead 6 via a switch s, as in FIG. 1.

Figure 2B:
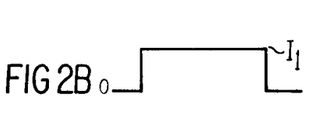
FIG. 2B illustrates the current provided by the constant current source of FIG. 2 that has the longer period in response to the input wave $V_{IN}$ of FIG. 2A.

The operation of the circuit of FIG. 2 will now be explained with the aid of FIGS. 2A through 2E. FIG. 2A illustrates the AC voltage $V_{IN}$ that is applied to the positive inputs of the comparators $C_1$ and $C_2$. The horizontal dashed lines in FIG. 2A indicate the voltages $T_1$ and $T_2$. While $V_{IN}$ is less than $T_1$ and therefore less than $T_2$, the outputs of the comparators $C_1$ and $C_2$ have negative voltages that are respectively blocked from the gate electrodes of $F_1$ and $F_2$ by the diodes $d_1$ and $d_2$. When $V_{IN}$ reaches the voltage $T_1$, the output voltage of the comparator $C_1$ becomes positive so as to cause current to flow through the diode $d_1$ and the resistor 28 and turn $F_1$ on. This permits current $I_1$ of the source 32 to flow to the output capacitor C as shown in FIG. 2B. A little later in the half-cycle, when $V_{IN}$ reaches the voltage $T_2$, the output voltage of the comparator $C_2$ becomes positive so as to cause current to flow through the diode $d_2$ and the resistor 30 and turn $F_2$ on.

Figure 2C:
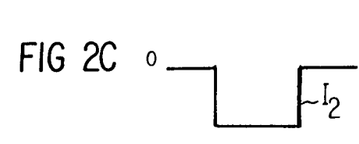
FIG. 2C illustrates the current provided by the constant current source of FIG. 2 having thge shorter period in response to the input wave $V_{IN}$ of FIG. 2A.
Figure 2D:
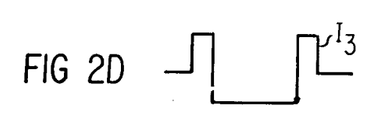
FIG. 2D illustrates the current flowing through the capacitor of FIG. 2 across which the automatic gain control voltage is developed, in response to an input wave of FIG. 2A.

This permits the current $I_2$ of the source 34 to flow from the output capacitor C as shown in FIG. 2C. FIG. 2D shows the net current $I_3$ flowing through the output capacitor C that causes the voltage across C to vary from its initial value $-V$. With the illustrated values of the amplitudes of $V_{IN}$, $T_1$ and $T_2$ and the amplitudes of $I_1$ and $I_2$, the integrated charging of the output capacitor C by $I_2$ is equal to the integrated discharging by $I_2$ so that the voltage on C after the charging and discharging are completed is the same as it was before, i.e., the start-up voltage $+V$. In this regard, note that the area under the curve of $I_1$ of FIG. 2B equals the area under the curve of $I_2$ of FIG. 2C. $I_1$ lasts longer than $I_2$ but has less amplitude. In this case, the start-up voltage is $+V$ but it could be $-V$ or any value that causes the voltage regulator to make the amplitude of $V_{IN}$ exceed $T_2$ so that the circuit can operate as described.

Figure 2E:
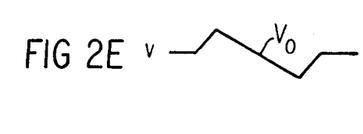
FIG. 2E illustrates the voltage produced across the capacitor of FIG. 2 across which the automatic gain control voltage is developed in response to an input wave of FIG. 2A.

If the amplitude of $V_{IN}$ increased as indicated by the dashed curve $V_{IN}'$ of FIG. 2A, the duration of the flow of $I_2$ would be a greater fraction of the duration of the flow of $I_1$ so that there would be a net charge flow through C in a direction to decrease its voltage from the start-up voltage. FIG. 2E shows the change in voltage across the capacitor C.

Figure 3:
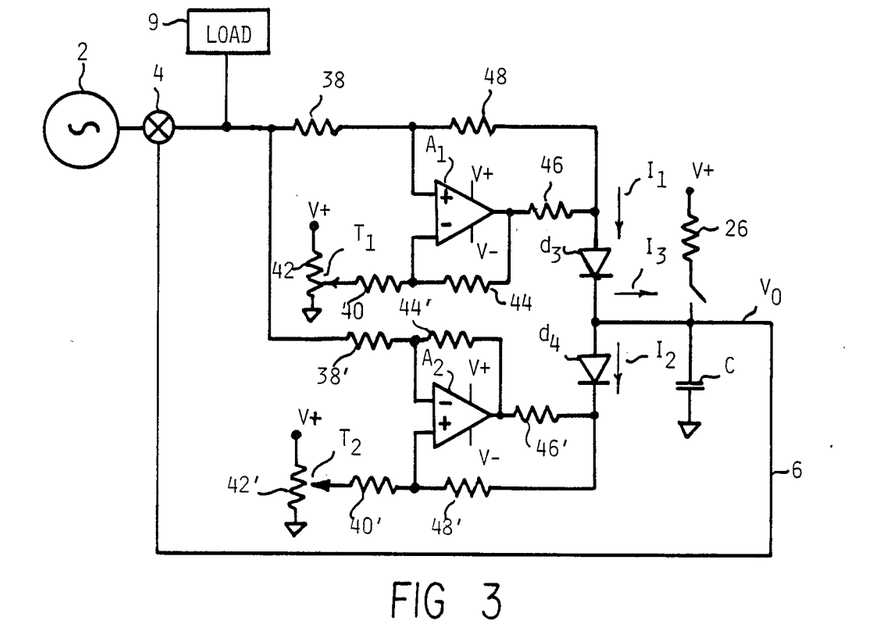
FIG. 3 is a schematic representation of a circuit embodying the invention in which operational amplifiers are the current sources.

FIG. 3 is a schematic diagram of a circuit embodying the invention in which operational amplifiers operating as voltage-to-current converters are used as the current sources. Components corresponding to those of FIG. 1 have the same designations. The AC wave from the regulator 4 is coupled via the capacitor 12 and a resistor 38 to the non-inverting input of an operational amplitifer $A_1$ and via the capacitor 12 and a resistor 38' to the inverting input of an operational amplifier $A_2$. The inverting input of $A_1$ is connected via a resistor 40 to a potentiometer 42 connected between $+V$ and ground, and the non-inverting input of $A_2$ is connected via a resistor 40' to a potentiometer 42' that is connected between $+V$ and ground. The potentiometer 42 supplies a voltage $T_1$ and the potentiometer 42' supplies a voltage $T_2$. The output of $A_1$ is connected via a resistor 44 to its inverting input and via series resistors 46 and 48 to its non-inverting input. The output of $A_2$ is connected via a resistor 44' to its inverting input and via series resistors 46' and 48' to its non-inverting input. Diodes $d_3$ and $d_4$ are connected in series with like polarity so that they can conduct current from the junction of the resistors 46, 48 to the junction of the resistors 46', 48'. The output capacitor C is connected between the junction of the diodes $d_3$ and $d_4$ and ground. The current $I_1$ that is caused to flow through $d_3$ by $A_1$ is equal to $K_1 V_{IN}$, and the current $I_2$ that is caused to flow through $d_4$ by $A_2$ is equal to $K_2 V_{IN}$, $K_1$ being greater than $K_2$.

Figure 3A:
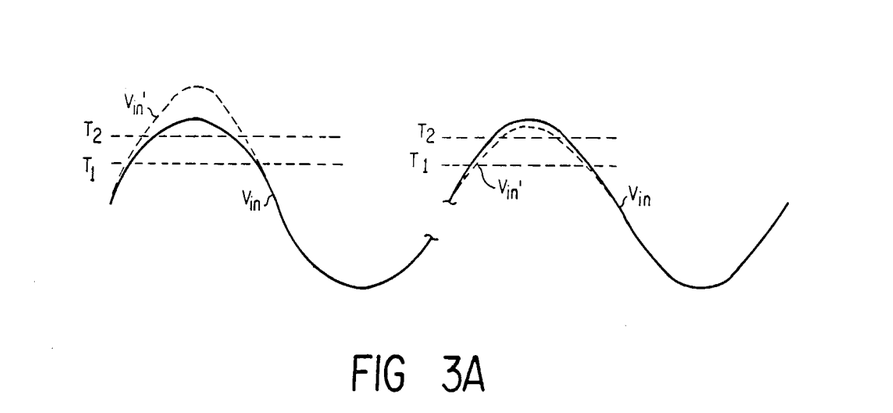
FIG. 3A represents an input wave $V_{IN}$ that is the same as that shown in FIG. 2A.
Figure 3B:
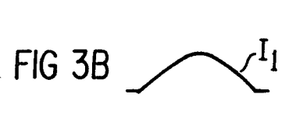
FIG. 3B illustrates the current provided by the current source of FIG. 3 having the longer period in response to the input wave of FIG. 3A.
Figure 3C:
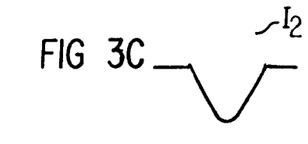
FIG. 3C illustrates the current provided by the current source of FIG. 3 having the shorter period in response to the input wave of FIG. 3A.
Figure 3D:
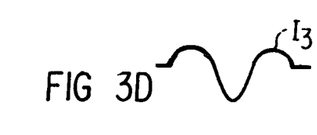
FIG. 3D illustrates the current flowing through the capacitor in FIG. 3 across which the automatic gain control voltage is developed in response to the input wave of FIG. 3A.
Figure 3E:
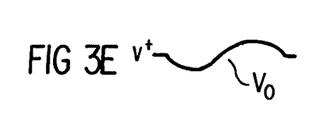
FIG. 3E illustrates the voltage produced across the capacitor of FIG. 3 across which the automatic gain control voltage is developed in response to the input wave of FIG. 3A.

The operation of the circuit of FIG. 3 will now be explained with the aid of FIGS. 3A through 3E. FIG. 3A illustrates the AC voltage $V_{IN}$ that is respectively applied to the resistors 38 and 38'. The dashed lines in FIG. 3A respectively represent the voltages $T_1$ and $T_2$ supplied by the potentiometers 42 and 42'. During the time that $V_{IN}$ is less than $T_1$ and therefore less than $T_2$, the output of $A_1$ is negative and the output of $A_2$ is positive so that no current can flow through either of the diodes $d_3$ and $d_4$. When, however, $V_{IN}$ reaches the voltage $T_1$, the output of $A_1$ becomes positive so as to cause a current $I_1 = K_1 V_{IN}$ to flow through the diode $d_3$ to the output capacitor C as illustrated in FIG. 3B. A little later in the half-cycle of $V_{IN}$, when $V_{IN}$ reaches the amplitude of $T_2$, the output of $A_2$ becomes negative so as to cause a current $I_2 = K_2 V_{IN}$ to flow from the output capacitor C through the diode $d_4$ as indicated in FIG. 3C. FIG. 3D shows the net current $I_3$ flowing through the capacitor C that causes the voltage across C to vary as shown in FIG. 3E. With the illustrated values of the amplitude of $V_{IN}$, $T_1$ and $T_2$ and the values of $K_1$ and $K_2$, the capacitor C is charged as much as it is discharged so that its voltage returns to its initial value of $+V$. In this case, the area under the curve $I_1$ of FIG. 3B equals the area under the curve $I_2$ of FIG. 3C.

If, however, the amplitude of $V_{IN}$ decreases, as indicated by the dashed line $V_{IN}$ of FIG. 3A, the integrated flow of $I_2$ to the integrated flow of $I_1$ would be smaller so that there would be a net charge flow C in a direction to increase its voltage from the start-up voltage $+V$.

What is claimed is:

1. A circuit for deriving a gain control voltage that varies in value with changes in the amplitude of a periodic alternating voltage wave, comprising
   an input to which alternating wave may be applied,
   a capacitor across which the gain control voltage is to appear,
   a current source responsive to an alternating voltage wave, when present at said input, for passing current to said capacitor only during first portions of each cycle of the alternating voltage wave,
   a current source responsive to an alternating wave, when present at said input, for passing current from said capacitor only during second portions of each cycle of the alternating voltage wave, said second portions having different duration than said first portions, the ratio of the durations of said first and second portions being related to the amplitude of the alternating voltage wave,
   said current sources being such that one passes the same amount of integrated current as the other during a cycle of the alternating voltage wave when the wave has a given amplitude, more integrated current than the other during a cycle of the alternating voltage wave when its amplitude is greater than the given amplitude, and less integrated current than the other during a cycle of the alternating voltage wave when its amplitude is less than the given amplitude.

2. A circuit as set forth in claim 1 wherein said current sources respectively supply different amlunts of constant current, the current being supplied by the current source that is operative for a lesser portion of each cycle delivering the larger amount of constant current.

3. A circuit as set forth in claim 1 wherein said current sources are amplifiers that are driven by the alternating current voltage wave while they are operative and wherein the amplifier for the current source that is operative for a lesser portion of a cycle has greater current gain than the amplifier for the other current source.

4. A circuit as set forth in claim 1 wherein one of said portions occurs while the alternating voltage wave exceeds a first value and the other of said portions occurs while the alternating voltage wave exceeds a second value that is different from the first.

5. A circuit as set forth in claim 1 wherein one of said portions occurs while the alternating voltage wave exceeds a first value and the other of said portions occurs while the alternating voltage wave exceeds a second value that is different from the first.

6. A circuit for deriving an automatic gain control voltage that varies with changes in amplitude of an alternating voltage wave, comprising
   a pair of input terminals, one of which is connected to ground,
   first and second transistors of the same conductivity type, each of said transistors having base, emitter and collector electrodes,
   a third transistor of the opposite conductivity type having base, emitter and collector electrodes,
   a direct current voltage supply having voltages that are above and below ground,
   said first transistor and a load resistor connected in series across said direct current voltage supply,
   said second and third transistors having their emitter-collector paths connected in series across said direct current voltage supply so that current can flow through them in the same direction as it flows through the emitter-collector path or said first transistor,
   a capacitor coupled between the ungrounded input terminal and the base electrodes of said first and second transistors,
   a resistor connected between the bases of said first and second transistors and one side of said direct current voltage supply,
   a connection from a point between the load resistor and said first transistor and the base electrode of said third transistor, and
   a capacitor connected to ground from the emitter of one of said second and thrid transistors and the collector of the other.

7. A circuit for deriving an automatic gain control voltage that varies with changes in amplitude of an alternating voltage wave, comprising
   A pair of input terminals to which the alternating voltage wave may be applied, one of said terminals being grounded,
   a first comparator having inverting and non-inverting inputs,
   a second comparator having inverting and non-inverting inputs,
   a direct current voltage supply having voltages that are above and below ground,
   a voltage divider coupled to one side of said direct current voltage supply for providing different direct current reference voltages to like inputs of said comparators,
   means for alternating current coupling the pair of input terminals to the other inputs of said first and second comparators,
   a capacitor having one side connected to ground,
   a first constant current source and a first switch connected in series between one side of said direct current voltage source and the ungrounded side of said capacitor so as to cause current to flow through said capacitor in one direction when said first switch is closed,
   a second constant current source and a second switch connected in series between the other side of said direct current voltage source and the ungrounded side of said capacitor so as to cause current to flow through said capacitor in the opposite direction when said second switch is closed, means for coupling the output of said first comparator to said first switch so as to cause said first switch to close while the alternating voltage wave applied to an input of said first comparator has a given polarity with respect to the reference voltage applied to the other input of said first comparator, and means for coupling the output of said second comparator to said second switch so as to cause said second switch to close while the alternating voltage wave applied to an input of said second comparator has said given polarity with respect to the reference voltage applied to the other input of said second comparator.

8. A circuit for deriving an automatic gain control voltage that varies with changes in amplitude of an alternating voltage wave, comprising a pair of input terminals to which the alternating voltage wave may be applied, one of said terminals being grounded, a first operational amplifier having positive and negative inputs and an output, a second operational amplifier having positive and negative inputs and an output, means for alternating current coupling said pair of input terminals to the positive input of one of said operational amplifiers and the negative input of the other operational amplifier, means for respectively applying different direct current voltages to the other inputs of said first and second operational amplifiers, a capacitor, one side of which is connected to ground, a first unilateral current conducting device connected between the output of said first operational amplifier and the ungrounded side of said capacitor, the polarity of said unilateral current conducting device being such as to block the flow of current when the alternating voltage wave applied to one of said inputs of said first operational amplifier is less than the direct current voltage applied to its other input and to permit the flow of current in one direction through said capacitor when the alternating voltage wave applied to one of said inputs of said first operational amplifier is greater than the direct current voltage applied to its other input, a second unilateral current conducting device connected between the output of said second operational amplifier and the ungrounded side of said capacitor, the polarity of said second unilateral current conducting device being such as to block flow of current between the input of said second operational amplifier and said capacitor, and to permit current to flow through said capacitor in a direction opposite to said one direction when the value of the alternating voltage wave applied to one of the inputs of said second operational amplifier exceeds the value of the direct current voltage applied to the other, the gain of the operational amplifier having the higher direct current voltage applied to one of its inputs being greater than the gain of the other operational amplifier.

9. A circuit comprising, an input to which a periodic wave may be applied, a capacitor, a first current source responsive to a wave at said input for delivering charge to said capacitor when the instantaneous amplitude of the wave has a given relationship to a first threshold, a second current source responsive to a wave at said input for removing charge from said capacitor when the instantaneous amplitude of the wave has a given relationship to a second threshold, said thresholds and current sources being such that the charge delivered to said capacitor by said first source during one cycle of the periodic wave is equal to the charge removed from said capacitor during one cycle of the periodic wave when the maximum amplitude of the periodic gave has a given value, and such that the charge delivered to and removed from said capacitor during one cycle of the periodic that the charge delivered to and removed from said capacitor during one cycle of the periodic wave are unequal when the maximum amplitude of the periodic wave is different from said given value.

10. A circuit as set forth in claim 9 wherein said current sources respectively supply different amounts of constant current, the current being supplied by the current source that is operative for a lesser portion of each cycle delivering the larger amount of constant current.

11. A circuit as set forth in claim 9 wherein said current sources are amplifiers that are driven by the alternating current voltage wave while they are operative and wherein the amplifier for the current source that is operative for a lesser portion of a cycle has greater current gain than the amplifier for the other current source.

* * * * *